United States Patent

Nakamoto et al.

(10) Patent No.: US 7,456,774 B2
(45) Date of Patent: Nov. 25, 2008

(54) ENCODER CIRCUIT AND A/D CONVERSION CIRCUIT

(75) Inventors: Hiroyuki Nakamoto, Kawasaki (JP); Kunihiko Gotoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/889,777

(22) Filed: Aug. 16, 2007

(65) Prior Publication Data

US 2007/0285301 A1 Dec. 13, 2007

Related U.S. Application Data

(62) Division of application No. 11/057,753, filed on Feb. 15, 2005, now Pat. No. 7,271,757.

(51) Int. Cl.
*H03M 1/36* (2006.01)

(52) U.S. Cl. .............. 341/160; 341/97; 341/98; 341/118; 341/120; 341/155

(58) Field of Classification Search ......... 341/118–120, 341/143–155, 161, 163
See application file for complete search history.

(56) References Cited

U.S. PATENT DOCUMENTS

| | | | |
|---|---|---|---|
| 4,586,025 A * | 4/1986 | Knierim | 341/64 |
| 4,712,087 A | 12/1987 | Traa | |
| 4,897,657 A | 1/1990 | Brubaker | |
| 5,029,305 A | 7/1991 | Richardson | |
| 5,243,348 A | 9/1993 | Jackson | |
| 5,315,301 A | 5/1994 | Hosotani et al. | |
| 5,329,279 A | 7/1994 | Babru et al. | |
| 5,382,955 A | 1/1995 | Knierim | |
| 5,459,466 A | 10/1995 | Knierim et al. | |
| 5,519,398 A | 5/1996 | Satoh et al. | |
| 5,623,265 A | 4/1997 | Pawar et al. | |
| 5,959,564 A | 9/1999 | Gross, Jr. | |
| 6,034,631 A | 3/2000 | Gross, Jr. | |
| 6,037,890 A * | 3/2000 | Glass et al. | 341/159 |
| 6,163,283 A * | 12/2000 | Schofield | 341/50 |
| 6,188,347 B1 | 2/2001 | Knudsen | |
| 6,218,975 B1 | 4/2001 | Tsukamoto et al. | |
| 6,222,476 B1 | 4/2001 | Lee et al. | |

(Continued)

FOREIGN PATENT DOCUMENTS

JP 05-145149 6/1993

(Continued)

OTHER PUBLICATIONS

European Search Report for Application No. EP 03 71 2939 (Feb. 17, 2006).

*Primary Examiner*—Linh V Nguyen
(74) *Attorney, Agent, or Firm*—Arent Fox LLP (57) ABSTRACT

An encoder circuit and A/D converter that can minimize the error of an encoder output with respect to all the possible combinations of thermometer codes are desired to be provided. To this end, an encoder circuit has a logic thereof configured to take a thermometer code as an input and to output as an encoded value a center value of a range in which one or more encoded values are distributed, the one or more encoded values corresponding to positions of one or more boundaries between "0" and "1" appearing in the thermometer code.

5 Claims, 9 Drawing Sheets

U.S. PATENT DOCUMENTS

| | | |
|---|---|---|
| 6,262,676 B1 | 7/2001 | King |
| 6,346,906 B1 * | 2/2002 | Nakaigawa ................ 341/160 |
| 6,388,602 B1 | 5/2002 | Yang |
| 6,396,424 B1 * | 5/2002 | Reyhani et al. ............. 341/97 |
| 6,441,768 B2 | 8/2002 | Cho et al. |
| 6,498,577 B1 | 12/2002 | Lin |
| 6,524,104 B2 | 2/2003 | Matsutani et al. |
| 6,542,104 B1 | 4/2003 | Capofreddi |
| 6,583,744 B2 | 6/2003 | Bright |
| 6,633,250 B2 | 10/2003 | Lee et al. |
| 6,642,873 B1 * | 11/2003 | Kuang ...................... 341/143 |
| 6,653,956 B2 * | 11/2003 | Tsukamoto ................ 341/97 |
| 6,696,990 B2 | 2/2004 | Pascucci |
| 6,703,956 B1 * | 3/2004 | Mueller et al. ............ 341/145 |
| 6,703,960 B2 * | 3/2004 | Kressin .................... 341/159 |
| 6,778,110 B2 | 8/2004 | Jansson |
| 6,889,235 B2 | 5/2005 | Athas |
| 6,965,331 B2 | 11/2005 | Demartini et al. |
| 7,068,201 B1 * | 6/2006 | Chou ....................... 341/144 |
| 2002/0044077 A1 | 4/2002 | Tsukamoto |

FOREIGN PATENT DOCUMENTS

| | | |
|---|---|---|
| JP | 06112824 A | 4/1994 |
| JP | 07-095089 | 4/1995 |
| JP | 08-036466 | 2/1996 |
| JP | 09107289 A | 4/1997 |
| JP | 11-103253 | 4/1999 |
| JP | 2000-134103 | 5/2000 |

* cited by examiner

FIG.1

| CASE | THERMOMETER CODE 3 | THERMOMETER CODE 2 | THERMOMETER CODE 1 | POSSIBLE VALUES OF ENCODER OUTPUT | RELATED ART | OTHER RELATED ART (BINARY SEARCH) (BOOLEAN ALGEBRA) | DISTANCE | ENCODER OUTPUT DESIRED FOR PURPOSE OF MINIMIZING CONVERSION ERROR |
|---|---|---|---|---|---|---|---|---|
| 1 | 1 | 1 | 1 | 3 | 3 | 3 | 0 | 3 |
| 2 | 1 | 1 | 0 | 3,2,1,0 | × | 3 | 3 | 2 or 1 |
| 3 | 1 | 0 | 1 | 3,2,1 | 2 | 1 | 2 | 2 |
| 4 | 1 | 0 | 0 | 3,2,1,0 | × | 0 | 3 | 2 or 1 |
| 5 | 0 | 1 | 1 | 2 | 2 | 2 | 0 | 2 |
| 6 | 0 | 1 | 0 | 2,1,0 | 1 | 2 | 2 | 1 |
| 7 | 0 | 0 | 1 | 1 | 1 | 1 | 0 | 1 |
| 8 | 0 | 0 | 0 | 0 | 0 | 0 | 0 | 0 |

| CASE | THERMOMETER CODE | | | OUTPUT OF EMBODIMENT 1 | ENCODER OUTPUT DESIRED FOR PURPOSE OF MINIMIZING CONVERSION ERROR | THERMOMETER/ BINARY CONVERSION ERROR |
|---|---|---|---|---|---|---|
| | 3 | 2 | 1 | | | |
| 1 | 1 | 1 | 1 | 3 | 3 | 0 |
| 2 | 1 | 1 | 0 | 2 | 2 or 1 | 1 |
| 3 | 1 | 0 | 1 | 2 | 2 | 0 |
| 4 | 1 | 0 | 0 | 2 | 2 or 1 | 1 |
| 5 | 0 | 0 | 1 | 2 | 2 | 0 |
| 6 | 0 | 1 | 0 | 1 | 1 | 0 |
| 7 | 0 | 1 | 1 | 1 | 1 | 0 |
| 8 | 0 | 0 | 0 | 0 | 0 | 0 |

| CASE | THERMOMETER CODE | | | OUTPUT OF EMBODIMENT 2 | NUMBER OF "1"S IN THERMOMETER CODE | ENCODER OUTPUT DESIRED FOR PURPOSE OF MINIMIZING CONVERSION ERROR | THERMOMETER/ BINARY CONVERSION ERROR |
|---|---|---|---|---|---|---|---|
| | 3 | 2 | 1 | | | | |
| 1 | 1 | 1 | 1 | 3 | 3 | 3 | 0 |
| 2 | 1 | 1 | 0 | 2 | 2 | 2 or 1 | 1 |
| 3 | 1 | 0 | 1 | 2 | 2 | 2 | 0 |
| 4 | 1 | 0 | 0 | 1 | 1 | 2 or 1 | 1 |
| 5 | 0 | 1 | 1 | 2 | 2 | 2 | 0 |
| 6 | 0 | 1 | 0 | 1 | 1 | 1 | 0 |
| 7 | 0 | 0 | 1 | 1 | 1 | 1 | 0 |
| 8 | 0 | 0 | 0 | 0 | 0 | 0 | 0 |

| CASE | THERMOMETER CODE | | | | | ENCODER OUTPUT |
|---|---|---|---|---|---|---|
| | 4 | 3 | 2 | 1 | 0 | |
| 1 | 1 | 1 | 1 | 1 | X | 4 |
| 2 | 0 | 1 | 1 | 1 | X | 3 |
| 3 | X | 1 | 1 | 0 | X | 2 |
| 4 | X | 1 | 0 | 1 | X | 2 |
| 5 | X | 1 | 0 | 0 | X | 2 |
| 6 | X | 0 | 1 | 1 | X | 2 |
| 7 | X | 0 | 1 | 0 | X | 1 |
| 8 | X | 0 | 0 | 1 | X | 1 |
| 9 | X | 0 | 0 | 0 | 1 | 0 |
| 10 | X | 0 | 0 | 0 | 0 | −1 |

ENCODER CIRCUIT AND A/D CONVERSION CIRCUIT

CROSS-REFERENCE TO RELATED APPLICATION

This is a Divisional of application Ser. No. 11/057,753 filed Feb. 15, 2005, now U.S. Pat. No. 7,271,757 which claims the benefit of priority from Application No. PCT/JP2003/003654 filed Mar. 25, 2003. The disclosure of the prior application is hereby incorporated by reference herein in its entirety.

BACKGROUND OF THE INVENTION

1. Field of the Invention

The present invention generally relates to encoder circuits used in A/D converters or the like, and particularly relates to an encoder circuit that converts thermometer codes into binary codes.

2. Description of the Related Art

With the development of digital signal processing technologies, A/D converters are required to have increasingly high resolution and increasingly high precision. In order to satisfy such demand, it is vital to suppress the generation of error in the process time of A/D conversion.

In A/D converters, generally, an analog potential is input into a plurality of comparator circuits, which compare the input potential with respective reference potentials. The reference potentials are provided at equal intervals from the low potential to the high potential. The output of the comparator set is like "0 . . . 000111 . . . 1" where the outputs of the lower-order comparators are "1" and the outputs above a certain comparator situated halfway from lower order to higher order are "0". Such codes are referred to as thermometer codes.

For example, an exclusive-OR operation is performed between adjacent bits in a thermometer code, thereby extracting "1" only at the boundary between "0" and "1". This detection signal may be converted into a binary code by a switch matrix and/or amplifier at a subsequent stage.

In A/D converters, however, the boundary between "0" and "1" that is supposed to appear only at one position may appear at two or more positions due to deviation in the inherent offset of each comparator, difference in clock signal delays when the comparators are operated at high frequency, signal fluctuation caused by noise, etc. In such a case, a straightforward encoder circuit that detects the boundary between "0" and "1" for the encoding purpose cannot cope with the situation, resulting in the generation of the code that is far cry from an originally intended correct binary code.

The encoder circuit designed to avoid an increase in the A/D conversion error even in the presence of thermometer code error has been developed (Patent Document 1). This encoder circuit performs an exclusive-OR operation between adjacent bits in the thermometer code, so that the inputting of an error code such as "0 . . . 001011 . . . 1" results in three consecutive bits becoming "1" as indications of "0/1" boundaries in the outputs of the exclusive-OR operation. A switch matrix then performs weighting such that "1" at the center of the plurality of "1" bits becomes effective as a boundary. At the end, an amplifier amplifies the weighted signal to determine "0"/"1". This successfully corrects error so as to obtain a code that is close to the originally intended correct binary code.

Further, Patent Document 2 discloses a binary search conversion method for encoding thermometer codes. This method divides a thermometer code by half at the centrally located bit, and conducts searches to find the position of the boundary in the halved codes according to "0"/"1" of the centrally located bit. Patent Document 3 and Patent Document 4 disclose a conversion method that conforms to a thermometer/binary conversion formula represented in Boolean algebra.

Figure 1:
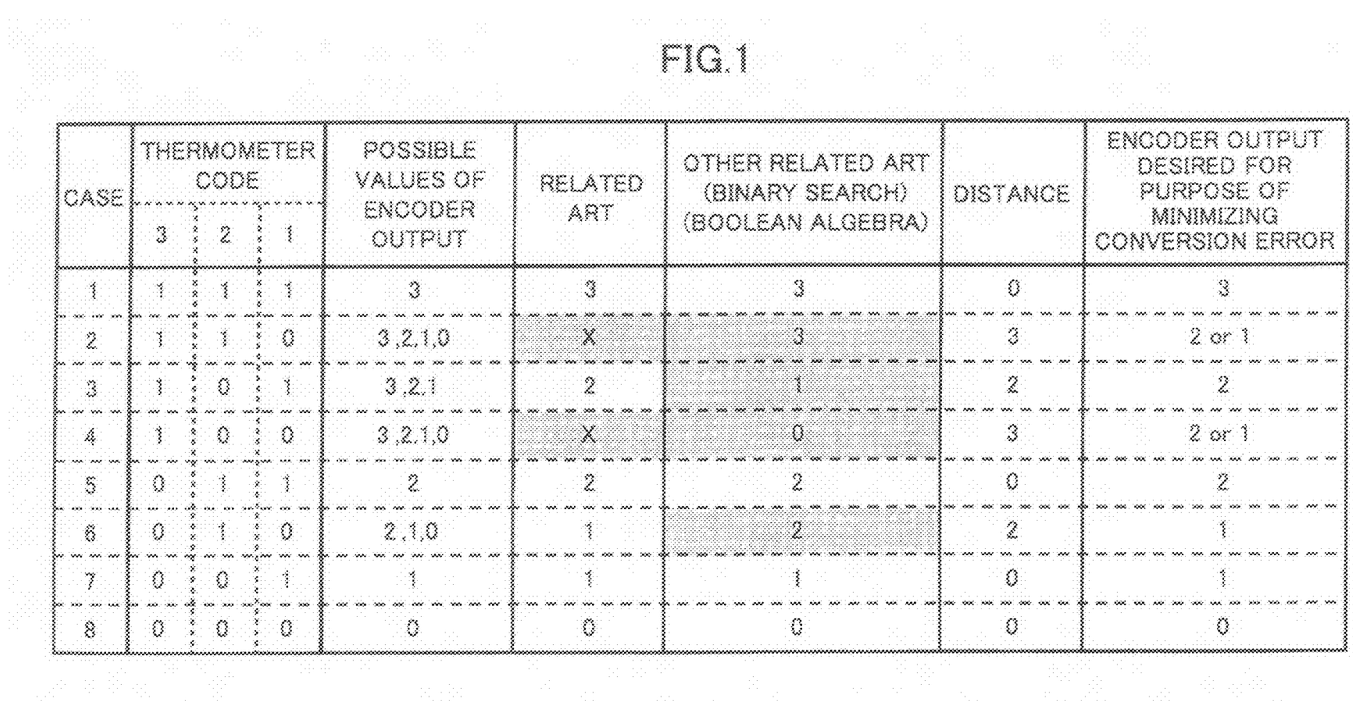
FIG. 1 is a drawing showing output values obtained when 3-bit thermometer codes are input into related-art encoder circuits.

FIG. 1 shows output values obtained when 3-bit thermometer codes are input into the related-art encoder circuit as described above. Here, a total of eight patterns are shown with respect to the three bits of the thermometer code, including all the combinations of "0" and "1" that may occur at the time of error.

When a thermometer having error is input, two or more boundaries between "0" and "1" are in existence. The encoded output thus varies depending on which boundary is treated as a correct boundary. In the case of Case 6 shown in FIG. 1, for example, it is impossible to determine whether the abnormal thermometer code [0, 1, 0] should have correctly been [0, 1, 1], or [0, 0, 1], or [0, 0, 0]. When two or more "0"/"1" boundaries exist in this manner, two or more possibilities exist as a correct encoded value. This is shown as "POSSIBLE VALUES OF ENCODER OUTPUT" in FIG. 1. When there are two or more "POSSIBLE VALUES OF ENCODER OUTPUT", a difference between the largest value and the smallest value is indicated as "DISTANCE".

Cases 1, 5, 7, and 8 correspond to the situation where a proper thermometer code is entered. In such cases, any one of the related-art examples produces a correct encoded output.

Cases 3 and 6 correspond to the situation where an input thermometer code is abnormal, resulting in three possibilities as the encoded output. At this time, "DISTANCE" is 2. In Case 3, for example, BIT2 and BIT3 of the thermometer code constitute an abnormal pattern. For this input to be a proper thermometer code, BIT2 and BIT3 of the thermometer code should be [1, 1], [0, 1], or [0, 0] instead of [1, 0]. In this case, the possible outputs of the encoder are 3, 2, and 1, respectively.

Accordingly, when the thermometer code of Case 3 is input, and it is desired to minimize the average distance between the output of the encoder and all the possible outputs, the output of the encoder is preferably set to 2 that is the median of the possible outputs 3, 2, and 1 of the encoder. In the case of Case 6, by the same token, the output of the encoder is preferably set to 1. The optimum encoder output that is obtained in such a manner is shown in FIG. 1 as "ENCODER OUTPUT DESIRED FOR PURPOSE OF MINIMIZING CONVERSION ERROR".

Cases 2 and 4 correspond to the situation in which there are four possible patterns for the encoder output, i.e., the "DISTANCE" is 3. In Case 2, for example, BIT1, BIT2, and BIT3 of the thermometer code constitute an abnormal pattern. For this input to be a proper thermometer code, the thermometer code should be [1, 1, 1], [0, 1, 1], [0, 0, 1], or [0, 0, 0] instead of [1, 1, 0]. In this case, the possible outputs of the encoder are 3, 2, 1, and 0, respectively.

Accordingly, when the thermometer code of Case 2 is input, and it is desired to minimize the average distance between the output of the encoder and all the possible outputs, the output of the encoder is preferably set to 2 or 1 that is the median of the possible outputs 3, 2, 1, and 0 of the encoder. In the case of Case 4, by the same token, the output of the encoder is preferably set to 2 or 1.

What is shown as "RELATED ART" IN FIG. 1 is the output of the encoder disclosed in Patent Document 1, and what is shown as "OTHER RELATED ART" is the output of the encoder disclosed in Patent Documents 2 through 4. As shown in FIG. 1, there are cases in which the output becomes unfixed "X" with respect to "RELATED ART". With respect to "OTHER RELATED ART", the encoder output often differs from "ENCODER OUTPUT DESIRED".

In this manner, the related-art encoder circuits are not designed to take into account all the possible combinations of thermometer codes. Because of this, it is not possible to minimize the error of the encoder output when error occurs.

In consideration of what was described above, the present invention is aimed at providing an encoder circuit and A/D converter that can minimize the error of the encoder output with respect to all the possible combinations of thermometer codes.

Patent Document 1: Japanese Patent Application Publication No. 7-95089

Patent Document 2: Japanese Patent Application Publication No. 8-36466

Patent Document 3: Japanese Patent Application Publication No. 11-103253

Patent Document 4: Japanese Patent Application Publication No. 2000-134103

SUMMARY OF THE INVENTION

It is a general object of the present invention to provide an encoder circuit and A/D converter that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by an encoder circuit and A/D converter particularly pointed out in the specification in such full, clear, concise, and exact terms as to enable a person having ordinary skill in the art to practice the invention.

An encoder circuit according to the present invention has a logic thereof configured to take a thermometer code as an input and to output as an encoded value a center value of a range in which one or more encoded values are distributed, the one or more encoded values corresponding to positions of one or more boundaries between "0" and "1" appearing in the thermometer code.

The encoder circuit as described above has its logic configured such as to output an encoded value corresponding to the position of the "0"/"1" boundary in response to a normal thermometer code, and to output as a proper encoded value a center value of the distribution range of encoded values corresponding to the position of "0"/"1" boundaries in the case of an abnormal thermometer code. It is thus possible to cope with all the possible thermometer input patterns, so that the output never becomes unfixed regardless of the input patters. It is also possible to minimize the error of encoded outputs without failure.

According to another aspect of the present invention, an encoder circuit is characterized in that the number of "1"s (or "0"s) appearing in the thermometer code is used as an encoded output.

Further, an A/D conversion circuit according to the present invention is characterized by including a comparator set to output a thermometer code by comparing an input analog potential with a plurality of reference potentials by comparators, and the encoder circuit as described above to encode the thermometer code output from the comparator set.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

An encoder circuit according to the present invention is a logic circuit designed to output an encoded value corresponding to a boundary between "0" and "1" in the thermometer code output from a comparator set or the like. If there are two or more "0"/"1" boundaries, a center value of the distribution range of encoded values corresponding to the position of these boundaries is treated as a proper encoded value.

The logic of the encoder circuit of the present invention is designed by taking into account all the possible thermometer input patterns, so that its output never becomes unfixed regardless of the input patters. In the case of an abnormal thermometer code, a center value of the distribution range of encoded values corresponding to the position of "0"/"1" boundaries is treated as a proper encoded value, so that the error of the encoded output is kept to a minimum.

Figure 2:
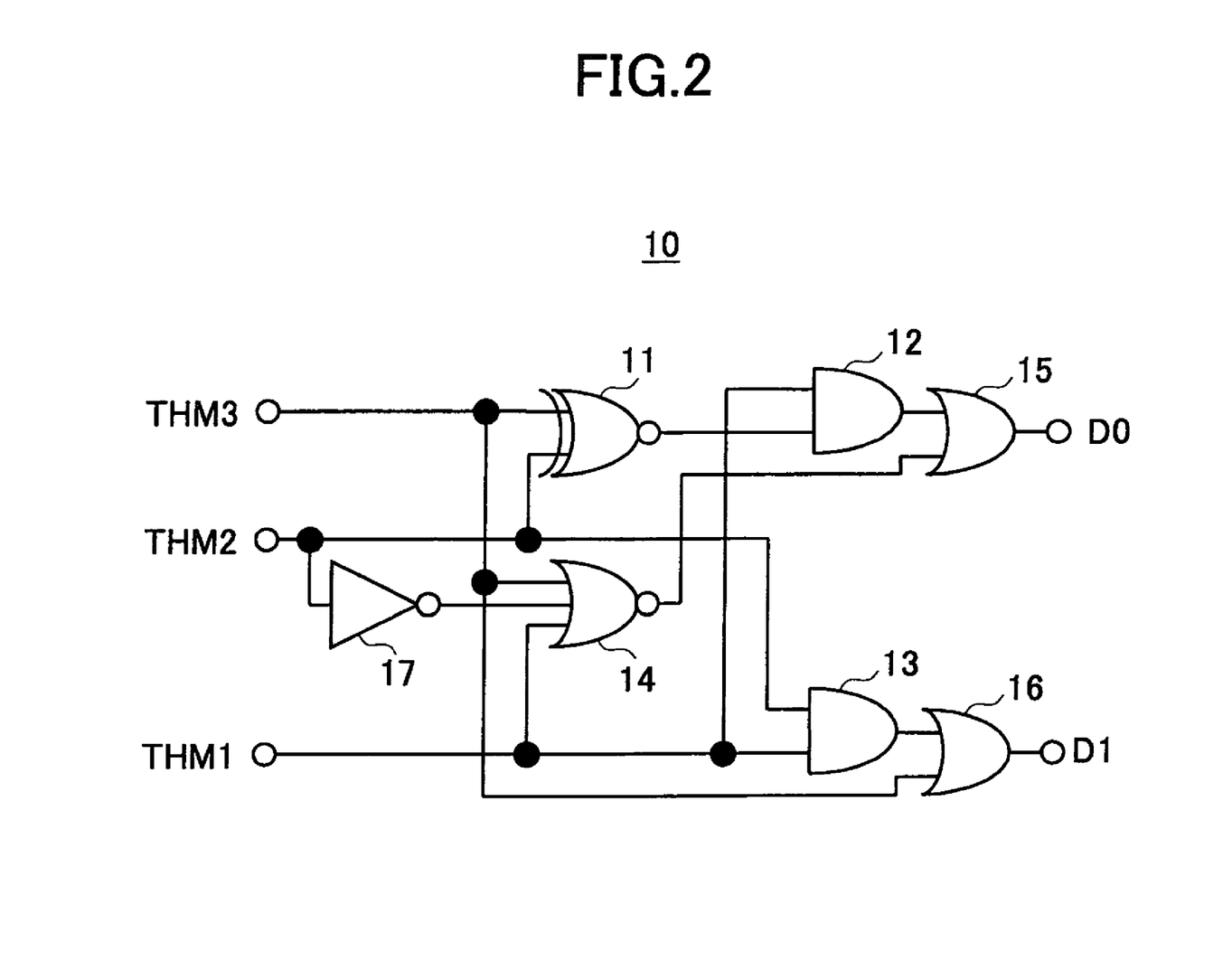
FIG. 2 is a diagram showing an example of the construction of a first embodiment of an encoder circuit according to the present invention.

FIG. 2 is a diagram showing an example of the construction of a first embodiment of the encoder circuit according to the present invention.

An encoder circuit 10 of FIG. 2 is a circuit that converts a 3-bit thermometer code into a binary value and outputs the binary value. For the sake of explanation, examples given here are directed to an input thermometer code that is comprised of 3 bits. The present invention, however, is not limited in terms of the number of bits of the input thermometer code, and is applicable to a thermometer code that is comprised of any number of bits as long as it is comprised of two or more bits.

An encoder circuit 10 of FIG. 2 includes EXNOR (inverted output of an EXOR gate) gate 11, AND gates 12 and 13, a NOR gate 14, OR gates 15 and 16, and an inverter 17. Input signals THM1 through THM3 correspond to BIT1 through BIT3 of the input thermometer code. Outputs D0 and D1 are an encoded output, which is a binary code converted from a thermometer code.

The logic gates shown in FIG. 2 implement a logic circuit that outputs as a proper encoded value a center value of the distribution range of encoded values corresponding to one or more "0"/"1" boundaries. The encoder circuit 10 of FIG. 2 is configured such that the larger of two center values is output if there are two center values. The output does not have to be the larger of two center values, and may alternatively be the smaller of the two center values. There is no reason to favor one over the other between the larger value and the smaller value.

Figure 3:
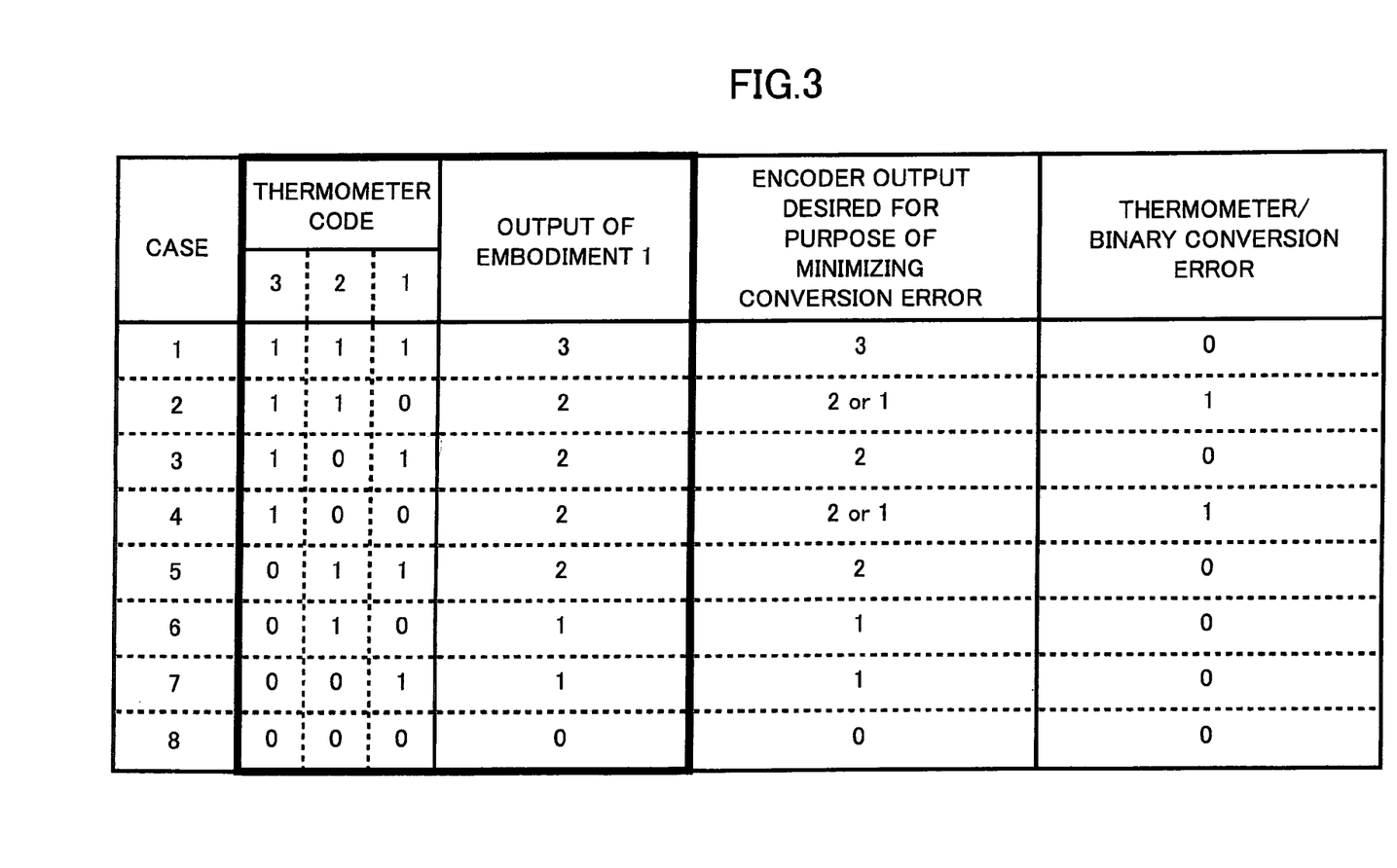
FIG. 3 is a diagram showing a truth table regarding the inputs and outputs of the encoder circuit according to the first embodiment shown in FIG. 2.

FIG. 3 is a diagram showing a truth table regarding the inputs and outputs of the encoder circuit 10 according to the first embodiment shown in FIG. 2.

The truth table of FIG. 3 shows all the eight "0"/"1" combinations with respect to the three bits that constitute the input thermometer code, and demonstrates the outputs of the encoder circuit 10 of FIG. 2 with respect to these eight combinations. In the same manner as in FIG. 1, "ENCODER OUTPUT DESIRED FOR PURPOSE OF MINIMIZING CONVERSION ERROR" is listed. Further listed is the difference between this value and the output of the encoder circuit 10 as "THERMOMETER/BINARY CONVERSION ERROR".

In Case 3, for example, boundaries exist at the position of BIT1 and at the position of BIT3. The two encoder outputs that correspond to the position of these two "0"/"1" boundaries are 1 and 3. As a result, the output of the encoder circuit 10 is set to 2, which is the center value of the distribution range [1-3] of these two encoder outputs.

In Case 2, "0"/"1" boundaries exist at the position of BIT0 and at the position of BIT3. The reason why the position of BIT0 constitutes a boundary is that there is imaginary BIT0 next to BIT1, and that BIT0 is "1" while BIT1 is "0". This approach is consistent with the fact that the position of BIT0 is treated as a boundary at the time of all-"0" pattern [0, 0, 0]. Further, the reason why the position of BIT3 constitutes a boundary is that there is imaginary BIT4 next to BIT3, and that BIT4 is "0" while BIT3 is "1". This approach is consistent with the fact that the position of BIT3 is treated as a boundary at the time of all-"1" pattern [1, 1, 1]. The two encoder outputs that correspond to the position of the two above-noted "0"/"1" boundaries are 0 and 3. The distribution range [0-3] of these two encoder outputs has two center values 1 and 2. In this example, the larger of the two center values is selected, so that the output of the encoder circuit 10 is set to 2.

In Case 4, "0"/"1" boundaries exist at the position of BIT0 and at the position of BIT3. The two encoder outputs that correspond to the position of these two "0"/"1" boundaries are 0 and 3. The distribution range [0-3] of these two encoder outputs has two center values 1 and 2. In this example, the larger of the two center values is selected, so that the output of the encoder circuit 10 is set to 2.

In the first embodiment as described above, a simple construction is used to implement the logic circuit that outputs as a proper encoded value a center value of the distribution range of encoded values corresponding to one or more "0"/"1" boundaries. This encoder circuit successfully suppresses error to a minimum even in such situations that the use of the related-art circuit configurations results in a large thermometer/binary conversion error (encoder output error).

Figure 4:
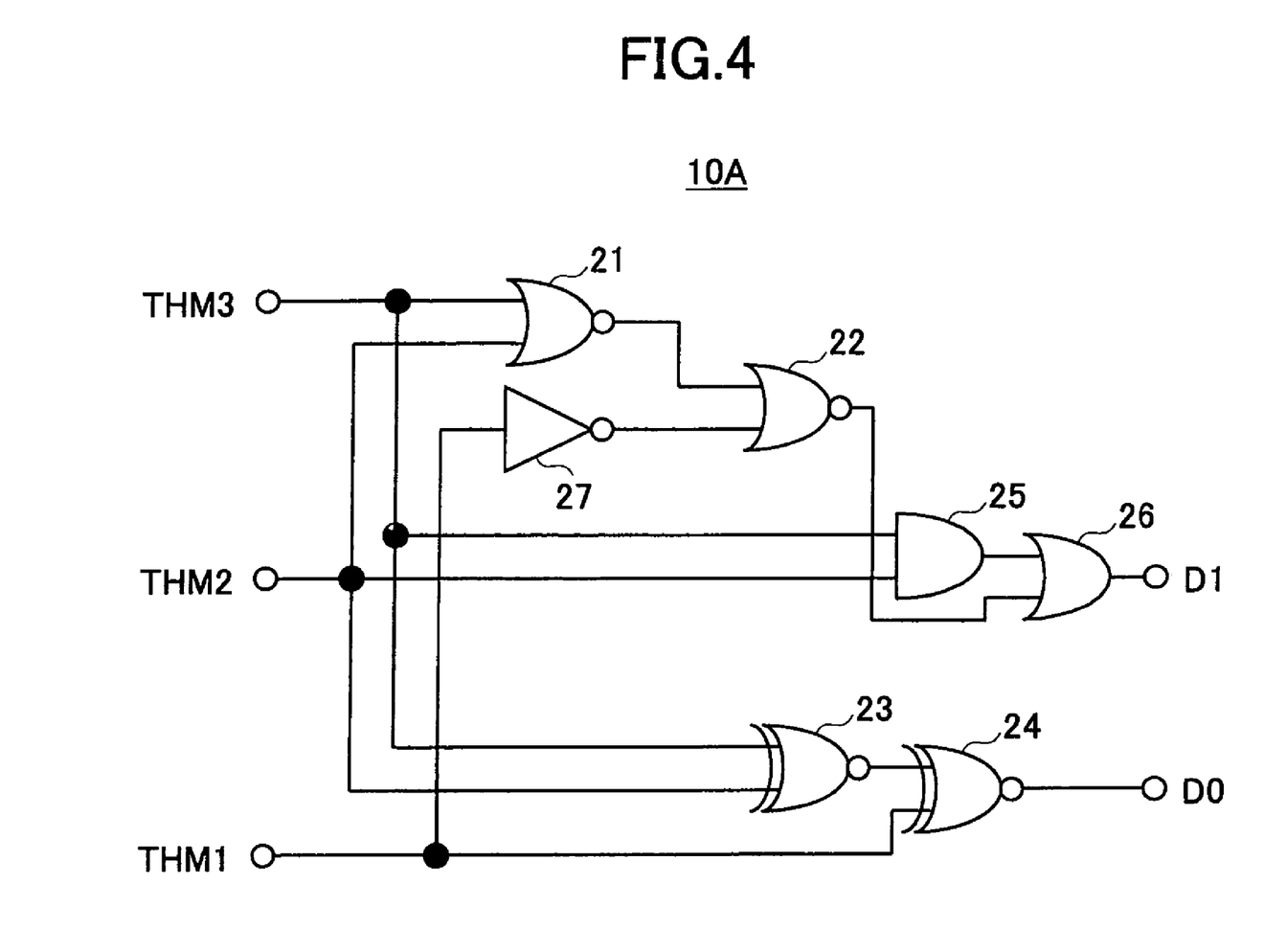
FIG. 4 is a diagram showing an example of the construction of a second embodiment of the encoder circuit according to the present invention.

FIG. 4 is a diagram showing an example of the construction of a second embodiment of the encoder circuit according to the present invention. For the sake of explanation, examples given here are directed to an input thermometer code that is comprised of 3 bits. The thermometer code, however, can be comprised of any number of bits as long as it is comprised of two or more bits.

An encoder circuit 10A of FIG. 4 includes NOR gates 21 and 22, EXNOR (inverted output of an EXOR gate) gates 23 and 24, an AND gate 25, an OR gate 26, and an inverter 27. These logic gates implement a logic circuit that outputs as a proper encoded value a center value of the distribution range of encoded values corresponding to one or more "0"/"1" boundaries.

Figure 5:
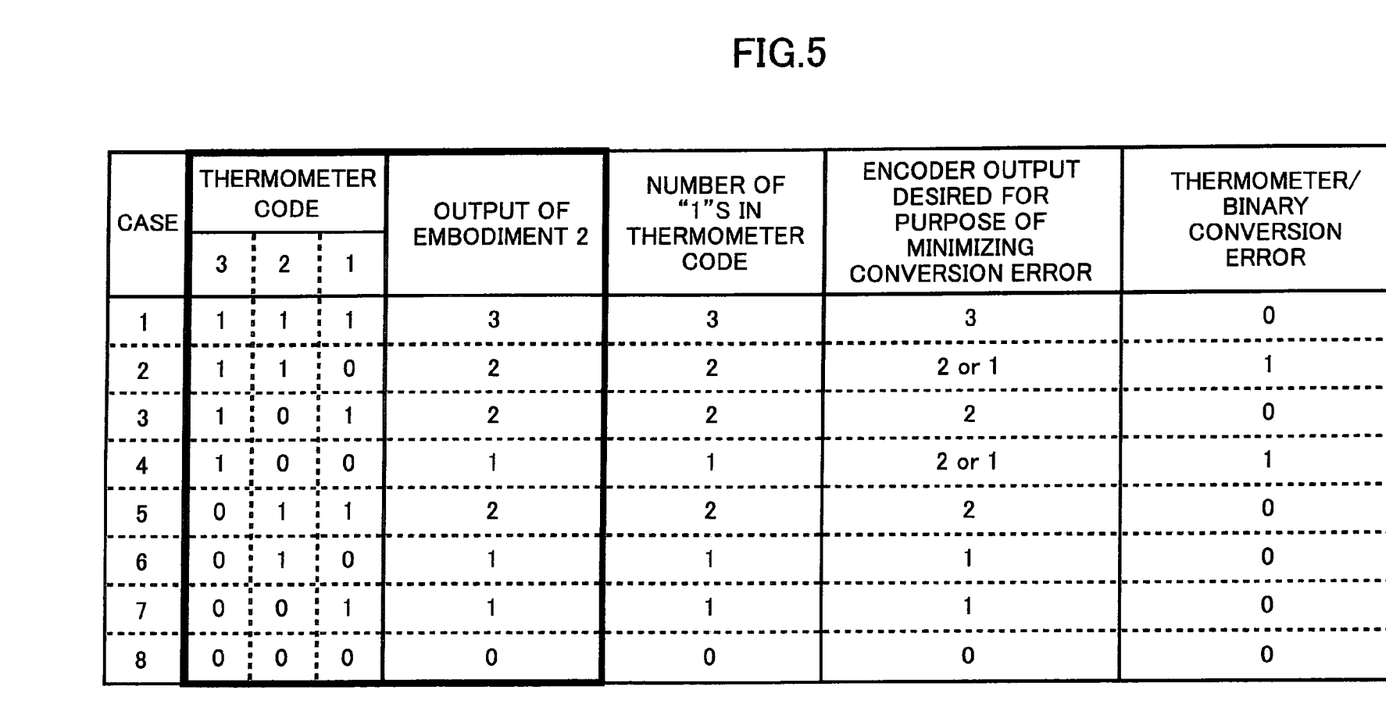
FIG. 5 is a diagram showing a truth table regarding the inputs and outputs of the encoder circuit according to the second embodiment shown in FIG. 4.

FIG. 5 is a diagram showing a truth table regarding the inputs and outputs of the encoder circuit 10A according to the second embodiment shown in FIG. 4.

The truth table of FIG. 5 shows the counts obtained by counting the number of "1"s in the thermometer code. As can be seen from FIG. 5, the number of "1"s in the thermometer code satisfies the conditions required to be an "ENCODER OUTPUT DESIRED FOR PURPOSE OF MINIMIZING CONVERSION ERROR". The logic of the encoder circuit 10A of FIG. 4 is designed such as to output the number of "1"s in the thermometer code. This achieves a logic circuit that outputs as a proper encoded value a center value of the distribution range of encoded values corresponding to one or more boundaries.

It is a phenomenon peculiar to the case of a 3-bit thermometer code that the number of "1"s in the thermometer code corresponds to the center value of the distribution range, and this is not applicable to four or more bits. The counting of the number of "1"s, however, is equivalent to moving "0"s and "1"s of the thermometer code to the left-hand side and to the right-hand side, respectively, to from separate groups, thereby identifying a single imaginary "0"/"1" boundary. Even in the case of a thermometer code comprised of 4 or more bits, a single boundary is identified by counting the number of "1"s so as to determine a single encoded output.

In the second embodiment as described above, a simple construction is used to implement the logic circuit that outputs the number of "1"s appearing in the thermometer code. This encoder circuit successfully suppresses error to a minimum even in such situations that the use of the related-art circuit configurations results in a large thermometer/binary conversion error (encoder output error).

Figure 6:
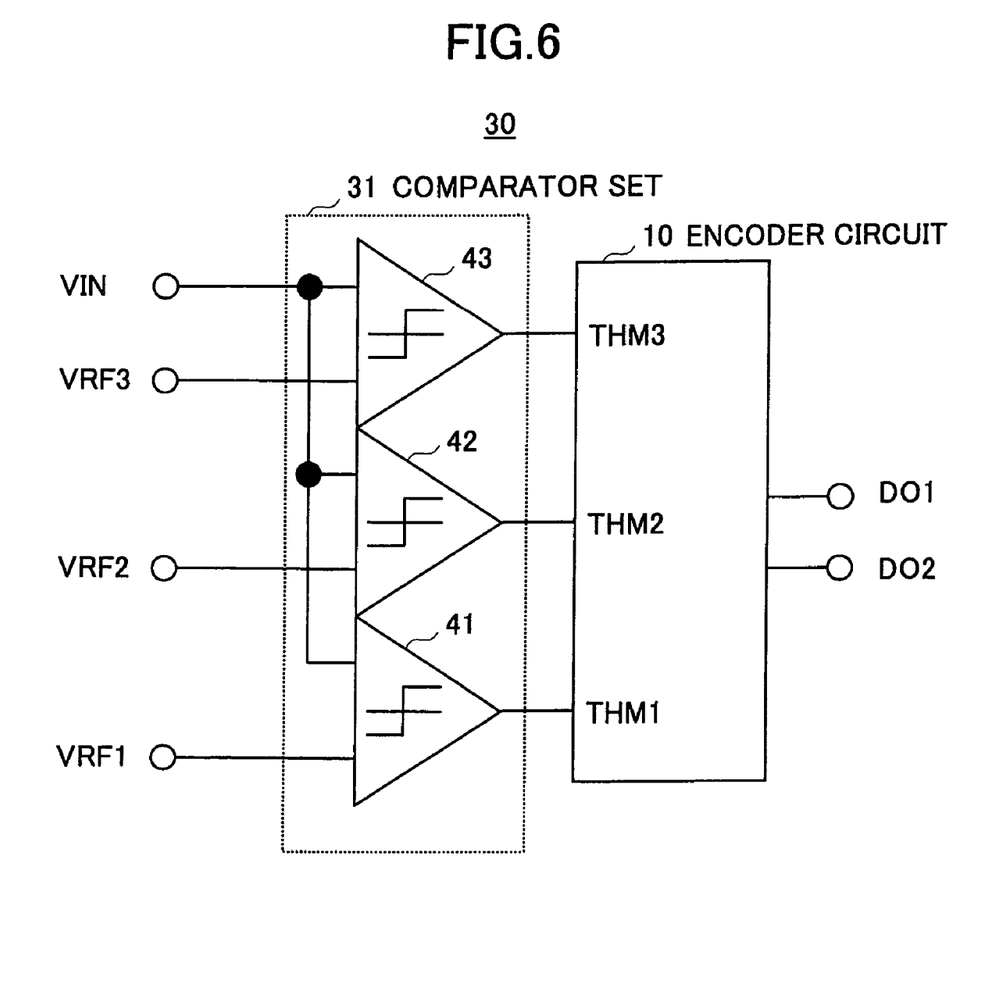
FIG. 6 is a diagram showing a first embodiment of an A/D conversion circuit according to the present invention.

FIG. 6 is a diagram showing a first embodiment of the A/D conversion circuit according to the present invention.

An A/D conversion circuit 30 of FIG. 6 includes the encoder circuit 10 and a comparator set 31. In place of the encoder circuit 10 that is shown in FIG. 2, the encoder circuit 10A shown in FIG. 4 may be used. The comparator set 31 includes comparators 41 through 43. The comparators 41 through 43 receive an input analog potential VIN, and also receive respective reference potentials VRF1 through VRF3. The comparators 41 through 43 compare the input analog potential VIN with the respective reference potentials to output the result of the comparison as thermometer codes THM1 through THM3.

The encoder circuit 10 encodes the thermometer codes THM1 through THM3 supplied from the comparator set 31, and outputs binary codes D0 and D1. Here, the encoder circuit 10 is configured to output as a proper encoded value a center value of the distribution range of encoded values corresponding to one or more "0"/"1" boundaries. The encoder circuit 10 is thus able to suppress the error of the encoded output to a minimum with respect to an abnormal thermometer code. Namely, the result of A/D conversion is obtained with its error being kept to a minimum even if there is a factor to create an abnormal thermometer code such as the offsets of the comparators 41 through 43, signal fluctuation caused by noise, etc.

Figure 7:
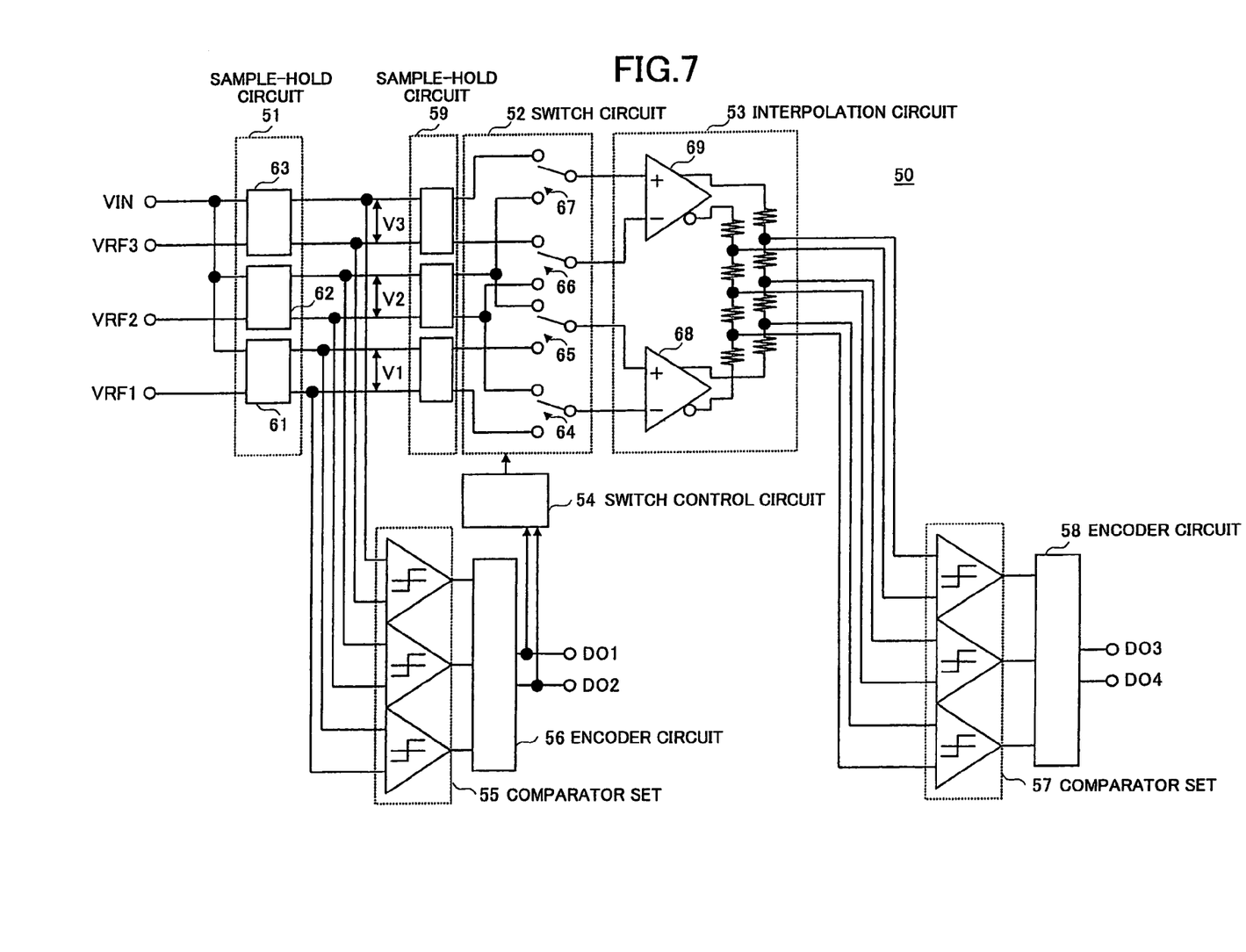
FIG. 7 is a diagram showing a second embodiment of the A/D conversion circuit according to the present invention.

FIG. 7 is a diagram showing a second embodiment of the A/D conversion circuit according to the present invention.

An A/D conversion circuit 50 of FIG. 7 includes sample-hold circuits 51 and 59, a switch circuit 52, an interpolation circuit 53, a switch control circuit 54, a comparator set 55, an encoder circuit 56, a comparator set 57, and an encoder circuit 58. The sample-hold circuit 51 includes individual sample-hold circuits 61 through 63 for sampling input voltages at predetermined timing and thereafter holding the sampled voltages. The switch circuit 52 includes switches 64 through 67 controlled by the switch control circuit 54. The interpolation circuit 53 includes differential amplifiers 68 and 69 for amplifying the sampled voltages selected by the switch circuit 52, and also includes a resister ladder for interpolating these voltages.

The comparator sets 55 and 57 may have the same configuration as the comparator set 31. The encoder circuits 56 and 58 may have the same configuration as the encoder circuit 10 or 10A. An A/D conversion portion comprised of the comparator set 55 and the encoder circuit 56 outputs two upper-order bits DO1 and DO2 of the result of A/D conversion of the input analog potential VIN. An A/D conversion portion comprised of the comparator set 57 and the encoder circuit 58 outputs the two lower-order bits DO3 and DO4.

The sample-hold circuit 51 samples and holds the reference potentials VRF1 through VRF3 and the input analog potential VIN. The reference potentials VRF1 through VRF3 and the input analog potential VIN being held are compared by the comparator set 55 as to their magnitude relationships. The encoder circuit 56 capable of error correction according to the present invention is then used to generate the higher-order binary signals DO1 and DO2.

In response to the binary signals DO1 and DO2, the switch control circuit 54 controls the set of switches provided in the switch circuit 52. While the control signals from the comparator set 55 to the switch control circuit 54 are being generated, the sample-hold circuit 59 samples the voltages held by the sample-hold circuit 51. Provision is made such that the sample-hold circuit 59 outputs its held voltages at the timing at which the switch control circuit 54 outputs signals. With this provision, two sets of analog signals corresponding to "0"/"1" boundaries are transmitted from the sample-hold circuit 51 to the interpolation circuit 53. If VIN is positioned between VRF1 and VRF2, for example, the switches 64 and 65 are controlled such as to couple VRF1 and VIN to the differential amplifier 68, and the switches 66 and 67 are controlled to couple VRF2 and VIN to the differential amplifier 69.

The interpolation circuit 53 divides the potentials of the two selected sets of analog signals into quarters after amplification. When the two lower-order bits (4 gray-scale levels) are to be obtained as in the above example, the difference between VRF1 and VRF2 is divided into quarters. The divided voltages are supplied to the comparator set 57 for comparison operation. A thermometer code indicative of the result of this comparison is encoded by the encoder circuit 58 capable of error correction according to the present invention, thereby generating the lower-order binary signals DO3 and DO4.

Figure 8:
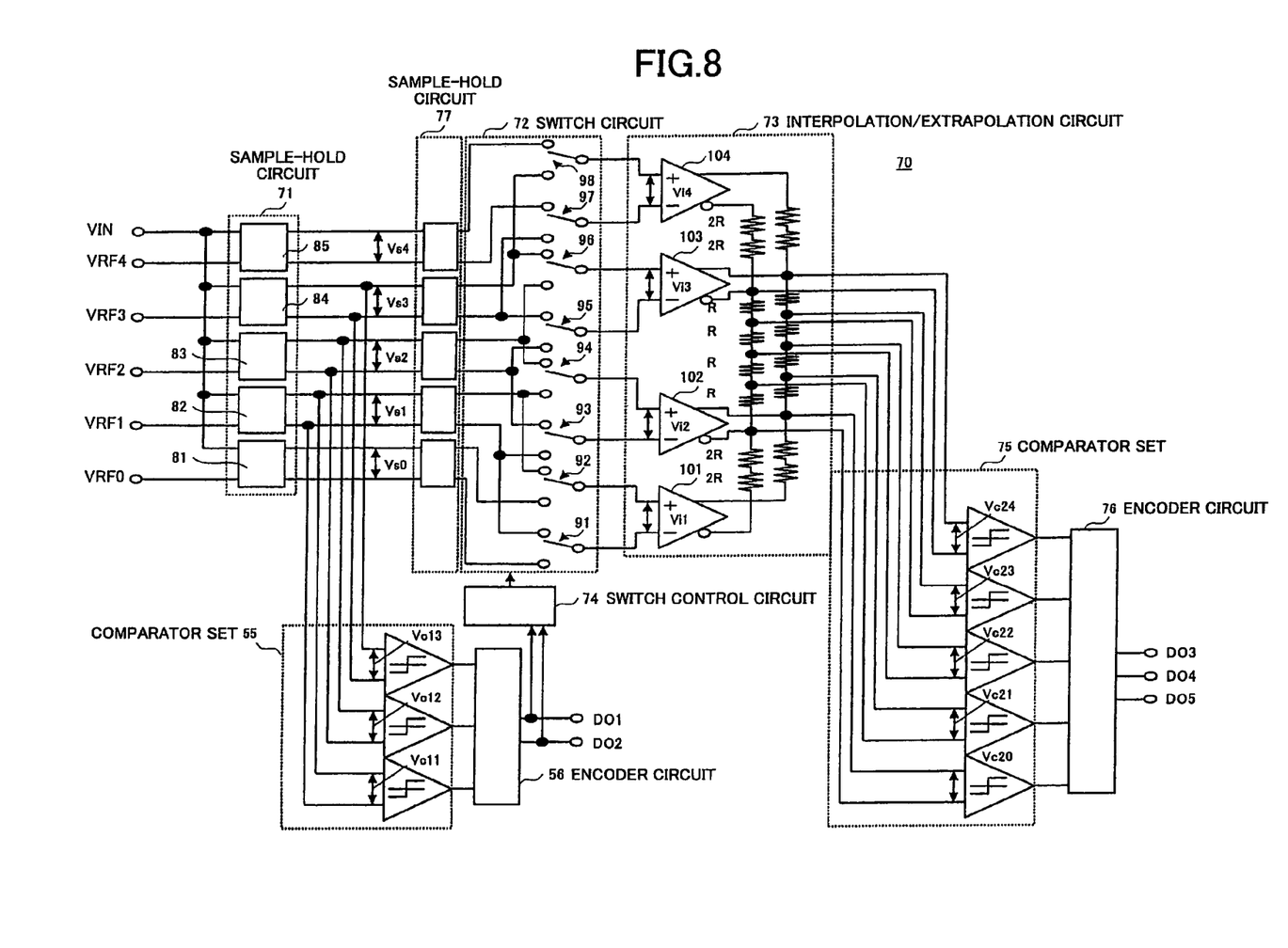
FIG. 8 is a diagram showing a third embodiment of the A/D conversion circuit according to the present invention.

FIG. 8 is a diagram showing a third embodiment of the A/D conversion circuit according to the present invention. In FIG. 8, the same elements as those of FIG. 7 are referred to by the same numerals, and a description thereof will be omitted.

An A/D conversion circuit 70 of FIG. 8 includes sample-hold circuits 71 and 77, a switch circuit 72, an interpolation/extrapolation circuit 73, a switch control circuit 74, the comparator set 55, the encoder circuit 56, a comparator set 75, and an encoder circuit 76. The sample-hold circuit 71 includes individual sample-hold circuits 81 through 85 for sampling input voltages at predetermined timing and thereafter holding the sampled voltages. The switch circuit 72 includes switches 91 through 98 controlled by the switch control circuit 74. The interpolation circuit 73 includes differential amplifiers 101 through 104 for amplifying the sampled voltages selected by the switch circuit 72, and also includes a resister ladder for interpolating and extrapolating these voltages.

The operation of each circuit performed when the A/D conversion circuit 70 of FIG. 8 generates a binary code is basically the same as the operation of each circuit of the A/D conversion circuit 50 shown in FIG. 7. However, the A/D conversion circuit 70 of FIG. 8 is configured such that a correct encoded output is obtained even when erroneous upper-order bits DO1 and DO2 are generated in response to the occurrence of an abnormal thermometer code. To this end, the interpolation/extrapolation circuit 73 is provided with an extrapolation function, and the encoder circuit 76 is designed to cope with extrapolation.

In the following description, it is assumed that VRF1<VIN<VRF2, and that VIN is situated closer to VRF2. In this case, the sign of the output voltages of the sample-hold circuit 71 and the comparison result of the comparator set 55 are:

$$(Vs4, Vs3, Vs2, Vs1, Vs0) = (.,.,.,.,.)$$

$$(Vc13, Vc12, Vc11) = (.,.,.).$$

As a result, the output thermometer code of the comparator set 55 is set to 001. In this case, the encoded output of the encoder circuit 56 is 1 when represented in decimal numbers, and is 01 when represented in binary numbers (DO1, DO2).

Based on the output of the encoder circuit 56, the switch control circuit 74 controls the switch circuit 72 so that the inputs into the interpolation/extrapolation circuit 73 are set as follows.

$$(Vi4, Vi3, Vi2, Vi1) = (Vs3, Vs2, Vs1, Vs0) = (.,.,.,.)$$

In this manner, the switch circuit 72 is controlled by the switch control circuit 74 such that the inputs Vi2 and Vi3 of the differential amplifiers 102 and 103 situated at the center in the case of normal operation correspond to a boundary between plus and minus.

In the case of this example, it is assumed that VIN is between VRF2 and VRF1 and closer to VRF2. The result is thus as follows.

$$(Vc24, Vc23, Vc22, Vc21, Vc20) = (.,.,.,.,.)$$

Figure 9:
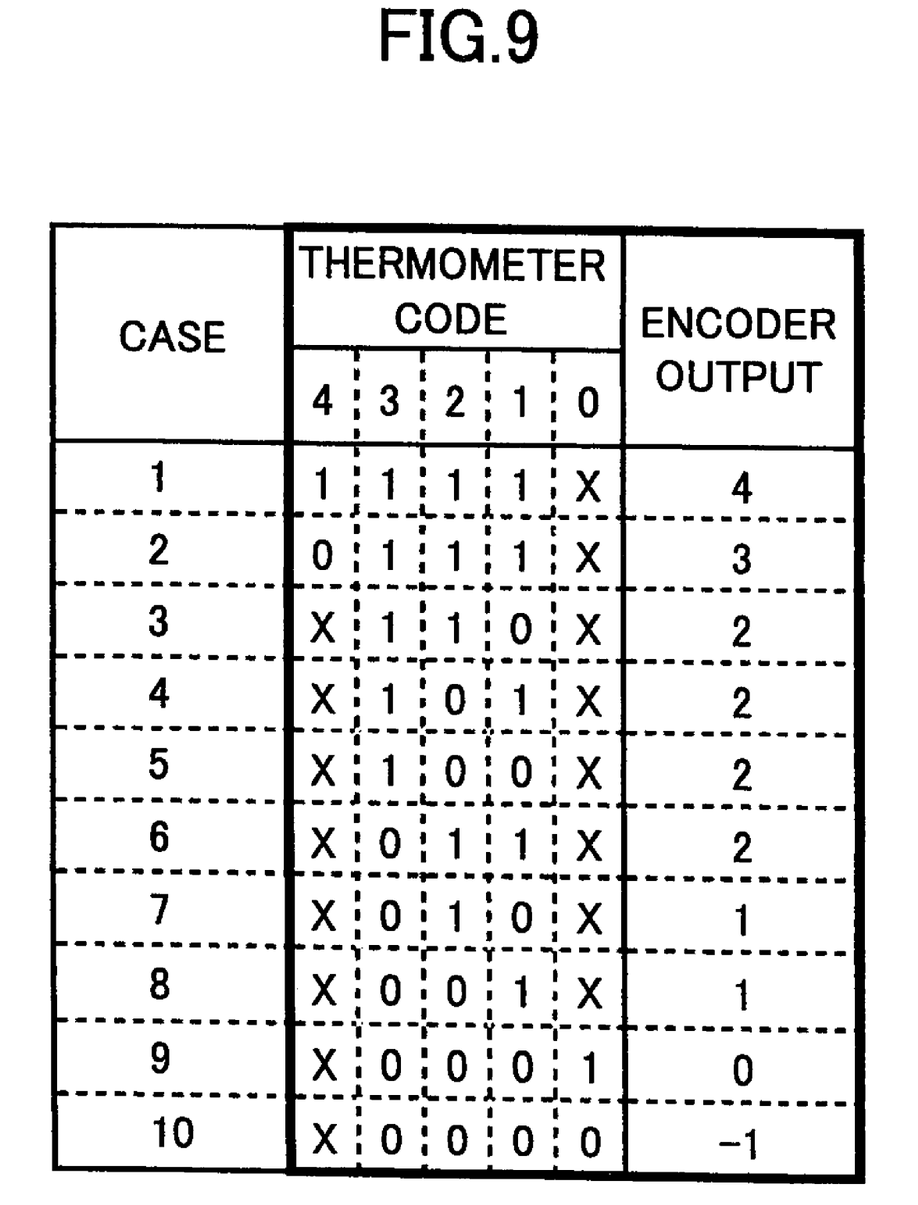
FIG. 9 is a diagram showing a truth table of the encoder circuit coping with extrapolation according to the principle of the present invention.

FIG. 9 is a diagram showing a truth table of the encoder circuit 76 coping with extrapolation according to the principle of the present invention. With reference to FIG. 9, the above example corresponds to Case 2 in which the output of the encoder circuit 76 is 3 in decimal representation, and is 011 in binary representation.

Accordingly, the output of the multi-stage A/D conversion circuit 70 becomes 0100+0011=0111.

The above description corresponds to the case in which the thermometer code is correctly obtained. In the following, a description will be given of the case in which the thermometer code is abnormal.

As in the above description, the sign of the output voltages of the sample-hold circuit 71 and the comparison result of the comparator set 55 are:

$(Vs4, Vs3, Vs2, Vs1, Vs0)=(-,-,-,-,-)$ $(Vc13, Vc12, Vc11)=(-,-,-)$.

Now, the scenario to be contemplated is that the output thermometer code of the comparator set 55 is set to 101 rather than to 001. As can be seen from the truth table of FIG. 3, the encoded output of the encoder circuit 56 is 2 when represented in decimal number, and is 10 when represented in binary number (DO1, DO2).

Based on the output of the encoder circuit 56, the switch control circuit 74 controls the switch circuit 72 so that the inputs into the interpolation/extrapolation circuit 73 are set as follows.

$(Vi4,Vi3,Vi2,Vi1)=(Vs4,Vs3,Vs2,Vs1)=(-,-,-,-)$

Namely, since the switch control is carried out based on the binary number "10", the four potentials situated one stage higher than those in the case of normal operation (i.e., the binary code "01") are connected.

In this case, Vi3 and Vi2 are both "−". The result is thus as follows.

$(Vc24,Vc23,Vc22,Vc21,Vc20)=(-,-,-,-,-)$

With reference to FIG. 9, the above example corresponds to Case 10 in which the output of the encoder circuit 76 is −1 in decimal representation, and is 111 in binary representation (−1 in complementary representation).

Accordingly, the output of the multi-stage A/D conversion circuit 70 becomes 0100−0001=0111. In this manner, even if an abnormal thermometer code is generated, the multi-stage A/D conversion circuit 70 can correct error through the extrapolation function. The reason why error can be corrected by use of an extrapolation circuit capable of ±1 correction is because the encoder circuit of the present invention minimizes the thermometer/binary conversion error (within ±1).

Although the present invention has been described with reference to embodiments, the present invention is not limited to these embodiments. Various variations and modifications may be made without departing from the scope of the claimed invention.

What is claimed is:

1. An A/D conversion circuit, characterized by comprising:
    a comparator set to output a thermometer code by comparing an input analog potential with a plurality of reference potentials by comparators; and
    an encoder circuit having a logic thereof configured to output as an encoded value a center value of a range in which one or more encoded values are distributed, said one or more encoded values corresponding to positions of one or more boundaries between "0" and "1" appearing in the thermometer code that is output from said comparator set;
    wherein the logic of the encoder circuit is configured to output the center value as the encoded value for all possible patterns of the thermometer code.

2. An A/D conversion circuit, characterized by comprising:
    a sample-hold circuit to sample and hold an input analog potential and a plurality of reference potentials;
    a first comparator set responsive to outputs of said sample-hold circuit to output a thermometer code by comparing the input analog potential with the plurality of reference potentials by comparators;
    a first encoder circuit having a logic thereof configured to output as an encoded value a center value of a range in which one or more encoded values are distributed, said one or more encoded values corresponding to positions of one or more boundaries between "0" and "1" appearing in the thermometer code that is output from said first comparator set;
    a switch circuit to select some outputs of said sample-hold circuit;
    a switch control circuit to control said switch circuit in response to the output of said first encoder circuit;
    an interpolation circuit to interpolate voltages between the outputs of said sample-hold circuit selected by said switch circuit;
    a second comparator set responsive to outputs of said interpolation circuit to output a thermometer code;
    a second encoder circuit having a logic thereof configured to output as an encoded value a center value of a range in which one or more encoded values are distributed, said one or more encoded values corresponding to positions of one or more boundaries between "0" and "1" appearing in the thermometer code that is output from said second comparator set.

3. The A/D conversion circuit claimed in claim 2, characterized in that said interpolation circuit is provided with an extrapolation function, and the logic of said second encoder circuit is configured to output an encoded value corresponding to an extrapolated value.

4. An A/D conversion circuit, characterized by comprising:
    a sample-hold circuit to sample and hold an input analog potential and a plurality of reference potentials;
    a first comparator set responsive to outputs of said sample-hold circuit to output a thermometer code by comparing the input analog potential with the plurality of reference potentials by comparators;
    a first encoder circuit having a logic thereof configured to output as an encoded value either one of a number of "0"s or a number of "1"s appearing in the thermometer code that is output from said first comparator set;
    a switch circuit to select some outputs of said sample-hold circuit;
    a switch control circuit to control said switch circuit in response to the output of said first encoder circuit;
    an interpolation circuit to interpolate voltages between the outputs of said sample-hold circuit selected by said switch circuit;
    a second comparator set responsive to outputs of said interpolation circuit to output a thermometer code;
    a second encoder circuit having a logic thereof configured to output as an encoded value either one of a number of "0"s or a number of "1"s appearing in the thermometer code that is output from said second comparator set.

5. The A/D conversion circuit claimed in claim 4, characterized in that said interpolation circuit is provided with an extrapolation function, and the logic of said second encoder circuit is configured to output an encoded value corresponding to an extrapolated value.

* * * * *

UNITED STATES PATENT AND TRADEMARK OFFICE
CERTIFICATE OF CORRECTION

PATENT NO. : 7,456,774 B2  Page 1 of 1
APPLICATION NO. : 11/889777
DATED : November 25, 2008
INVENTOR(S) : Hiroyuki Nakamoto et al.

It is certified that error appears in the above-identified patent and that said Letters Patent is hereby corrected as shown below:

Title Page:

Item (62), Related U.S. Application Data, Please insert after now Pat. No. 7,271,757

--, which is a continuation of application No. PCT/JP03/03654, filed on March 25, 2003.--

Signed and Sealed this

Twenty-fourth Day of March, 2009

JOHN DOLL
*Acting Director of the United States Patent and Trademark Office*